United States Patent
Wu et al.

(10) Patent No.: US 12,029,061 B2
(45) Date of Patent: Jul. 2, 2024

(54) FLEXIBLE ELECTRONIC DEVICE

(71) Applicant: InnoLux Corporation, Miao-Li County (TW)

(72) Inventors: Yuan-Lin Wu, Miao-Li County (TW); Chia-Hung Hsieh, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 439 days.

(21) Appl. No.: 17/371,122

(22) Filed: Jul. 9, 2021

(65) Prior Publication Data
US 2022/0036773 A1    Feb. 3, 2022

(30) Foreign Application Priority Data
Jul. 31, 2020    (CN) .......................... 202010757856.9

(51) Int. Cl.
*H10K 50/84*    (2023.01)
*H10K 77/10*    (2023.01)

(52) U.S. Cl.
CPC ......... *H10K 50/841* (2023.02); *H10K 77/111* (2023.02)

(58) Field of Classification Search
CPC ........................... H10K 50/841; H10K 77/111

USPC ........................................................ 361/749
See application file for complete search history.

(56) References Cited

U.S. PATENT DOCUMENTS

| 2006/0132027 | A1* | 6/2006 | Gao ..................... H10K 50/841 313/506 |
| 2008/0182109 | A1 | 7/2008 | Hashimoto |
| 2015/0048349 | A1* | 2/2015 | Kawata ................. H10K 59/60 257/40 |
| 2016/0120023 | A1 | 4/2016 | Choi |
| 2016/0255713 | A1 | 9/2016 | Kim |
| 2017/0309844 | A1 | 10/2017 | Saeki |
| 2018/0061893 | A1 | 3/2018 | Breedlove |

FOREIGN PATENT DOCUMENTS

JP    2005-311171 A    11/2005

\* cited by examiner

*Primary Examiner* — Andargie M Aychillhum
(74) *Attorney, Agent, or Firm* — Winston Hsu

(57) ABSTRACT

A flexible electronic device is provided in this disclosure. The flexible electronic device includes a base layer, an electronic unit, and a cover layer. The electronic unit is disposed on the base layer, and the cover layer is disposed on the electronic unit. The base layer has a thickness T1 and a Young's modulus E1, and the cover layer has a thickness T2 and a Young's modulus E2, wherein the thickness T1, the thickness T2, the Young's modulus E1, and the Young's modulus E2 comply with following expression: $E2/E1 \leq 156.21 \times (T2/T1)^{-4.28}$.

19 Claims, 7 Drawing Sheets

FLEXIBLE ELECTRONIC DEVICE

BACKGROUND OF THE DISCLOSURE

1. Field of the Disclosure

The present disclosure relates to an electronic device, and more particularly, to a flexible electronic device including a base layer, an electronic unit, and a cover layer.

2. Description of the Prior Art

In recent years, foldable electronic devices or deformable electronic devices have become one of the development focuses of next generation electronic technology. However, the service life and/or reliability of the foldable electronic device are very important issues. Therefore, how to achieve the desired deformation effect, service life, and main functional effects of the electronic device itself (such as display effect, touch sensing effect, etc.) by modifying design of materials and/or structures is the direction of development in related fields.

SUMMARY OF THE DISCLOSURE

It is one of the objectives of the present disclosure to provide a flexible electronic device. Thicknesses and/or Young's modulus of a base layer and a cover layer are adjusted for matching each other and improving related properties of the electronic device.

A flexible electronic device is provided in an embodiment of the present disclosure. The flexible electronic device includes a base layer, an electronic unit, and a cover layer. The electronic unit is disposed on the base layer, and the cover layer is disposed on the electronic unit. The base layer has a thickness T1 and a Young's modulus E1, and the cover layer has a thickness T2 and a Young's modulus E2, wherein the thickness T1, the thickness T2, the Young's modulus E1, and the Young's modulus E2 comply with following expression:

$$E2/E1 \leq 156.21 \times (T2/T1)^{-4.28}.$$

These and other objectives of the present disclosure will no doubt become obvious to those of ordinary skill in the art after reading the following detailed description of the embodiment that is illustrated in the various figures and drawings.

DETAILED DESCRIPTION

Figure 1:
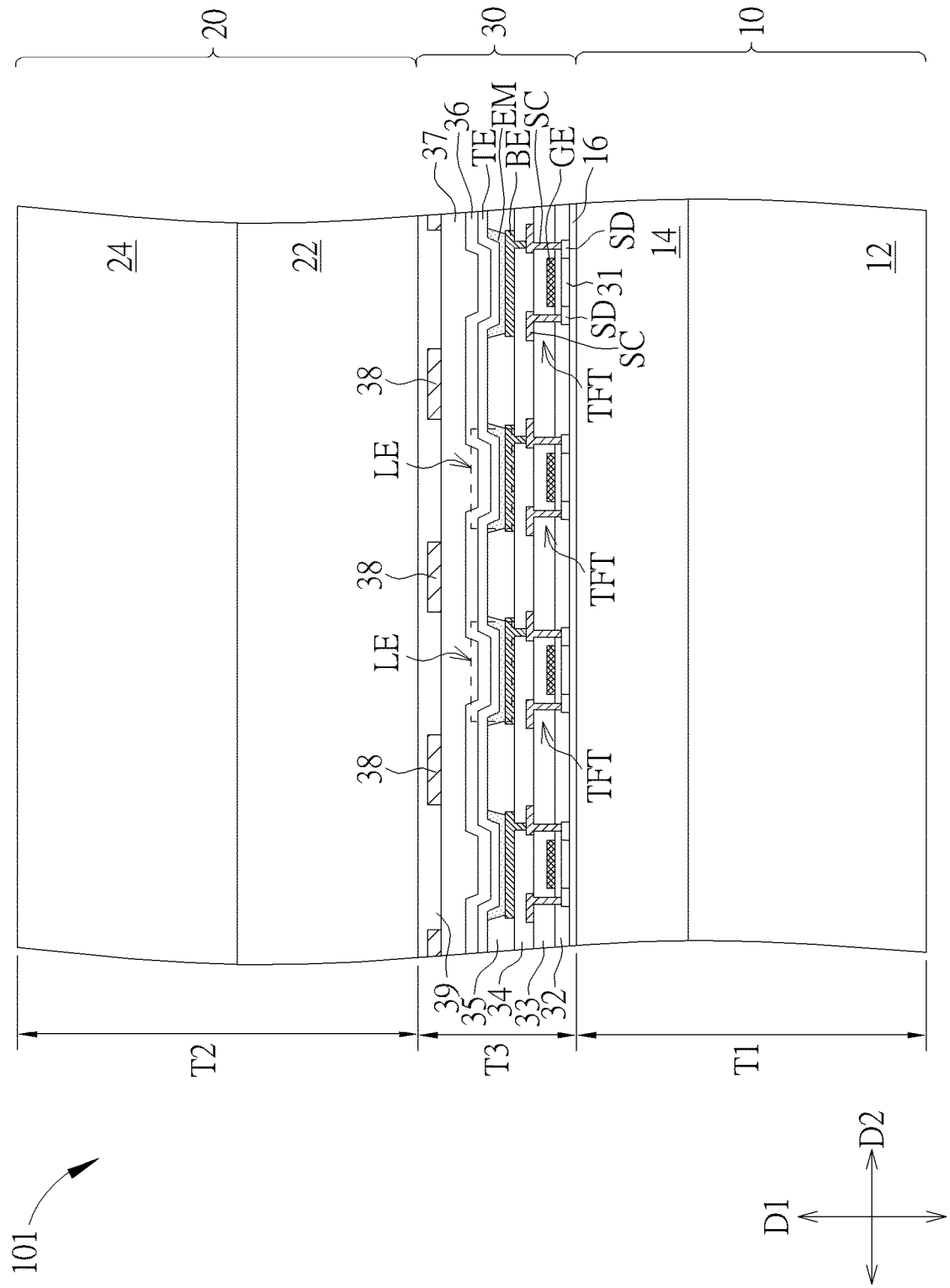
FIG. 1 is a schematic diagram illustrating a cross-sectional structure of an electronic device according to a first embodiment of the present disclosure.

This disclosure can be understood by referring to the following detailed description with the accompanying drawings. It should be noted that, in order to make it easy for readers to understand and for the simplicity of the drawings, the multiple drawings in this disclosure only illustrate a portion of the electronic device, and specific elements in the drawings are not drawn according to actual scale. In addition, the number and size of each element in the figure are only for illustration, and are not used to limit the scope of the disclosure.

Certain terms are used throughout the description and following claims to refer to particular components. As one skilled in the art will understand, equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ".

It will be understood that when an element or layer is referred to as being "on" or "connected to" another element or layer, it can be directly on or directly connected to the other element or layer, or intervening elements or layers may be presented (indirectly). In contrast, when an element is referred to as being "directly on" or "directly connected to" another element or layer, there are no intervening elements or layers presented.

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods. The use of these ordinal numbers is only used to make a claimed element with a certain name clear from another claimed element with the same name.

Herein, the terms "about", "approximately", "substantially", and "essentially" usually mean within 20%, or within 10%, or within 5%, or within 3%, or 2% or within 1%, or within 0.5% of a given value or range. The quantity given here is an approximate quantity, that is, the meaning of "about", "approximately", "substantially", and "essentially" can still be implied without specifying the terms "about", "approximately", "substantially", and "essentially".

It should be understood that embodiments are described below to illustrate different technical features, but these technical features may be mixed to be used or combined with one another in different ways without conflicting with one another.

Figure 2:
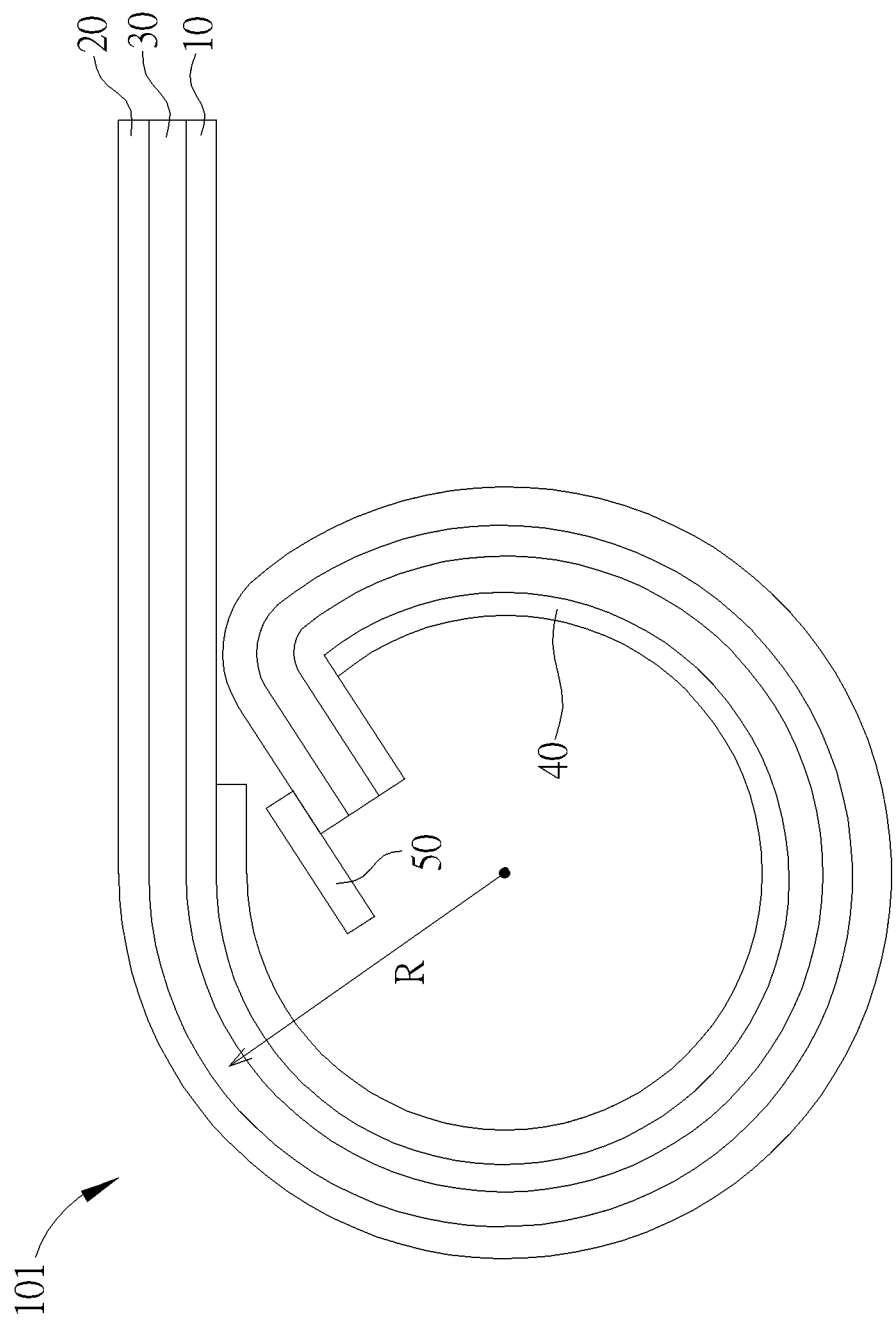
FIG. 2 is a schematic diagram illustrating a cross-sectional structure of an electronic device under bending condition according to an embodiment of the present disclosure.

Please refer to FIG. 1 and FIG. 2. FIG. 1 is a schematic diagram illustrating a cross-sectional structure of an electronic device 101 according to a first embodiment of the present disclosure, and FIG. 2 is a schematic diagram illustrating a cross-sectional structure of an electronic device (such as the electronic device 101, but not limited thereto) under bending condition according to an embodiment of the present disclosure. As shown in FIG. 1, the flexible electronic device 101 includes a base layer 10, an electronic unit 30, and a cover layer 20. The electronic unit 30 is disposed on the base layer 10, and the cover layer 20 is disposed on the electronic unit 30. The base layer 10 has a thickness T1 and a Young's modulus E1, and the cover layer 20 has a thickness T2 and a Young's modulus E2, wherein the thickness T1, the thickness T2, the Young's modulus E1, and the Young's modulus E2 comply with the following expression (I).

$$E2/E1 \leq 156.21 \times (T2/T1)^{-4.28} \quad (I)$$

The Young's modulus E1 and the Young's modulus E2 in the above formula are in the same unit, and the unit of Young's modulus is, for example, megapascal (MPa) or gigapascal (GPa), the thickness T1 and the thickness T2 are in the same unit, and the unit of thickness is, for example, micrometer (um) or angstrom (Å), but the present disclosure is not limited to this.

By controlling the thickness ratio and the Young's modulus between the base layer 10 and the cover layer 20 for conforming to the above-mentioned expression (I), the crack issue of circuits in the electronic unit 30 may be improved when the electronic device 101 is bent, and the reliability and/or the service life of the electronic device 101 may be improved accordingly.

As shown in FIG. 2, in some embodiments, the electronic device 101 may be a foldable and/or bendable electronic device, such as bending toward the base layer 10, but not limited thereto. In some embodiments, the electronic device 101 may bend toward the cover layer 20 according to some design considerations. In addition, the radius of curvature R marked in FIG. 2 may be regarded as the radius of curvature of the circuit in the electronic unit 30 in this bending condition, and the components in the electronic device 101 may have slightly different radii of curvature due to differences in relative positions. For example, the radius of curvature R may substantially range from 1 millimeter (mm) to 10 mm, but the above-mentioned expression (I) may also be applied to the condition where the radius of curvature R is greater than 10 mm. Additionally, in some embodiments, a support structure 40 and a circuit structure 50 may be disposed at an inner side of the electronic device 101 in this bending condition, the support structure 40 may be used to provide a supporting effect in this bending condition, and the circuit structure 50 may be electrically connected with the electronic device 101, but not limited thereto. The circuit structure 50 may include a printed circuit board (PCB), a tape carrier package (TCP) structure, a chip on film (COF) structure, other suitable circuit structure, or the combination thereof.

Specifically, as shown in FIG. 1, in some embodiments, the base layer 10 may include multiple material layers (such as a first layer 12 and a second layer 14 shown in FIG. 1) stacked in a vertical direction (such as a first direction D1 shown in FIG. 1), and the cover layer may include multiple material layers (such as a first layer 22 and a second layer 24 shown in FIG. 1) stacked in the first direction D1 also, but not limited thereto. The first layer 12 and the second layer 14 in the base layer 10 may have similar materials or different materials according to some design requirements, and the first layer 22 and the second layer 24 in the cover layer 20 may have similar materials or different materials according to some design requirements also. In some embodiments, the first layer 12 and the second layer 14 in the base layer 10 may respectively include a support layer and a flexible substrate, and the first layer 22 and the second layer 24 in the cover layer 20 may respectively include a functional layer (such as a polarizing layer and/or a retardation layer) and a protection layer, but not limited thereto. In some embodiments, the second layer 14 in the base layer 10 may include a functional layer (such as a polarizing layer and/or a retardation layer) also, or the base layer 10 may further include a functional layer disposed between the first layer 12 and the second layer 14, and other material layers (such as an adhesive layer, other support structures, etc.) may be disposed in the stacked structure of the base layer 10 and/or the stacked structure of the cover layer 20 according to some design requirements. For example, the cover layer 20 may further include an adhesive layer disposed between the electronic unit 30 and the first layer 22, but the present disclosure is not limited to this. In some embodiments, the material of the first layer 12 in the base layer 10 may include a polymer material, such as polyimide (PI), polyethylene terephthalate (PET), other suitable flexible materials, or a combination (such as a laminated structure) of the above-mentioned materials; the material of the second layer 14 in the base layer 10 may include PI, a flexible material containing silicon and oxygen, other suitable flexible materials, or a combination (such as a laminated structure) of the above-mentioned materials; the material of the first layer 22 in the cover layer 20 may include acrylate, poly methyl methacrylate (PMMA), other suitable flexible materials, or a combination (such as a laminated structure) of the above-mentioned materials; and the material of the second layer 24 in the cover layer 20 may include acrylate, PET, PMMA, a flexible material containing carbon, oxygen, nitrogen, silicon, fluorine, sulfur, antimony, and/or barium, other suitable flexible materials, or a combination (such as a laminated structure) of the above-mentioned materials, but not limited thereto. In other embodiments, the electronic device 101 may also include a support layer (not shown) disposed under the base layer 10, and the support layer may include, for example, a stainless steel plate and/or a patterned metal plate, but the present disclosure is not limited to this.

In some embodiments, the electronic unit 30 disposed between the base layer 10 and the cover layer 20 may include a display unit, an illumination unit, a touch sensing unit, a sensor (such as an optical sensor, a radiation sensor, etc.), or an electronic unit having other functions, and the electronic device may include a display device, a touch sensing device, a touch display device, a sensor device, an antenna device, or an electronic device having other functions. It should be noted that the electronic device may be any permutation and combination of the devices described above, but not limited thereto. The electronic device in this disclosure may be a flexible electronic device, and the "flexible" means that the electronic device can be curved, bent, folded, rolled, stretched and/or other similar deformation. In other embodiments, the flexible electronic device can maintain the bent shape after bending or can change the shape arbitrarily after bending. In some embodiments, the electronic device may include, for example, liquid crystal, fluorescence, phosphor, light emitting diode (LED), other suitable display mediums, or the combination thereof, but not limited thereto. The light emitting diode may include mini-LED, micro-LED, organic LED (OLED), quantum dot (QD) LED (such as QLED or QDLED), or the combination thereof. In other embodiments, the electronic device may include but is not limited to an electrophoretic display unit, a MEMS display unit, an electronic ink display unit, or a combination thereof. In some embodiments, the electronic unit 30 may provide display effect at a side facing the cover layer 20, but not limited thereto. In some embodiments, the electronic unit 30 may provide display effect at a side facing the base layer 10 according to some design requirements. In other words, the electronic device may be regarded as a single-sided display device, a dual-sided display device, or a transparent display device, but not limited thereto.

In some embodiments, the display unit described above may include a buffer layer 16, a dielectric layer 32, control elements TFT, a dielectric layer 33, a planarization layer 34, display elements LE, a pixel defining layer 35, a protection layer 36, and a packaging layer 37. Each of the control elements TFT may include a semiconductor layer 31, two source/drain electrodes SD, a gate electrode GE, and/or contact structures SC connected to the source/drain electrodes SD, respectively. In addition, the display unit may further include a first electrode BE, a second electrode TE, and a light emitting layer EM sandwiched between the first electrode BE and the second electrode TE. Each of the display elements LE may include a portion of the first electrode BE, a portion of the second electrode TE, and a portion of the light emitting layer EM sandwiched between the first electrode BE and the second electrode TE. In some embodiments, the bottom of the pixel defining layer 35 may be used to identify a region of one of the display elements LE, such as a dotted frame of the display element LE, but not limited thereto. Additionally, in some embodiments, the buffer layer 16 may include a single layer of a dielectric material, such as silicon oxide or silicon nitride, or the buffer layer 16 may include multiple layers of different dielectric materials, such as a multi-layer structure including silicon oxide and silicon nitride, but not limited thereto. The semiconductor layer 31 may be disposed on the buffer layer 16, and a part of the semiconductor layer 31 may be doped to be the source/drain electrodes SD, i.e. the source/drain electrode SD may be a part of the semiconductor layer 31, but not limited thereto. In some embodiments, the semiconductor layer 31 may include a polysilicon semiconductor layer, a metal oxide semiconductor layer, or other suitable semiconductor materials. The dielectric layer 32 may be disposed between the semiconductor layer 31 and the gate electrode GE, and the dielectric layer 33 may be disposed on the dielectric layer 32 and the gate electrode GE. The contact structure SC may penetrate through the dielectric layer 33 and a part of the dielectric layer 32 for being electrically connected with the corresponding source/drain electrode SD, and the planarization layer 34 may be disposed on the dielectric layer 33 and the contact structures SC. The first electrode BE, the light emitting layer EM, the second electrode TE, and the pixel defining layer 35 may be disposed on the planarization layer 34, the light emitting layer EM may be located in an opening formed with the pixel defining layer 35, and the packaging layer 37 may be disposed on the display elements LE and the pixel defining layer 35 for providing packaging effect and/or planarization effect, but not limited thereto.

The materials of the gate electrode GE, the contact structure SC, the first electrode BE, and the second electrode TE may include a metallic electrically conductive material (such as aluminum, molybdenum, copper, titanium, tungsten, steel, iron, magnesium, gold, silver, lead, tin, a combination thereof, or other suitable conductive materials) or a transparent electrically conductive material (such as indium tin oxide (ITO) or other suitable transparent electrically conductive materials). The dielectric layer 32, the dielectric layer 33, the protection layer 36, and the packaging layer 37 may include a single layer or a multi-layer structure including dielectric or insulation materials (such as silicon oxide, silicon nitride, aluminum oxide, or other suitable dielectric materials). In some embodiments, the gate electrode GE, the first electrode BE, and the second electrode TE may respectively include a reflection electrode, a transparent electrode, or a translucent electrode. The reflection electrode described above may be formed with materials, such as silver, germanium, aluminum, copper, molybdenum, titanium, tin, aluminum-neodymium (AlNd), aluminum alloy (ACX), or polymer aluminum (APC); the transparent electrode described above may include a transparent conducting oxide (TCO) electrode, such as an indium tin oxide (ITO) electrode or an indium zinc oxide (IZO) electrode; and the translucent electrode described above may include a metal thin film electrode, such as a magnesium silver alloy thin film electrode, a gold thin film electrode, a platinum thin film electrode, and/or an aluminum thin film electrode, but not limited thereto. The material of the planarization layer 34 and the material of the pixel defining layer 35 may respectively include an organic dielectric material (such as acrylic polymer material and/or a siloxane polymer material) or other suitable materials, but not limited thereto. It is worth noting that the driving circuit (such as the control element TFT) and the display element LE in the display unit of the present disclosure is not limited to the structure shown in FIG. 1 and other suitable types of driving circuits and/or display elements may be used according to some design requirements.

Additionally, in some embodiments, the electronic unit 30 further includes a plurality of sensing elements 38 and a dielectric layer 39 disposed between the packaging layer 37 and the first layer 22 of the cover layer 20, and the sensing elements 38 may be arranged and spaced in a horizontal direction (such as a second direction D2 shown in FIG. 1) for being located between the display elements LE, but not limited thereto. The sensing element 38 may include a touch sensing element, such as a resistive touch sensing element, a self-capacitive touch sensing element, a mutual-capacitive touch sensing element, an optical touch sensing element, a force sensing element, or other suitable types of touch sensing structures. In some embodiments, the sensing element 38 may also have other functions, such as an antenna, image sensor, a pressure sensor, a temperature sensor, and/or a gas sensor, but not limited thereto. In other words, the sensing element 38 may have one or more sensing functions according to some design requirements. In addition, the sensing element 38 may include a metallic electrically conductive material (such as copper, aluminum, molybdenum, titanium, tungsten, steel, iron, magnesium, gold, silver, lead, tin, a combination thereof, or other suitable conductive materials) or a transparent electrically conductive material (such as indium tin oxide (ITO) or other suitable transparent electrically conductive materials). The dielectric layer 39 may include a single layer or a multi-layer structure including dielectric or insulation materials (such as silicon oxide, silicon nitride, aluminum oxide, or other suitable dielectric materials). In some embodiments, the sensing element 38 may be regarded as a portion of the electronic unit 30, and the electronic unit 30 may include a metal layer made of copper, aluminum, molybdenum, titanium, tungsten, steel, iron, magnesium, gold, silver, lead, tin, a combination thereof, or other suitable metallic electrically conductive materials. For example, the metal layer may be a patterned circuit layer, such as at least a part of the gate electrode GE, the contact structure SC, the first electrode BE, the second electrode TE, and/or the sensing element 38 described above. In addition, the electronic unit 30 may include the buffer layer 16, and a thickness T3 of the electronic unit 30 in the first direction D1 may be regarded as a distance between a top surface of the dielectric layer 39 and a bottom surface of the buffer layer 16 in the first direction D1; a thickness T1 of the base layer 10 may include a thickness of the first layer 12 and a thickness of the second layer 14 in the first direction D1; and a thickness T2 of the cover layer 20 may include a thickness of the first layer 22 and a thickness of the second layer 24 in the first direction D1, but not limited thereto. Additionally, in the present disclosure, the method for measuring each thickness may include taking a single-point measurement result or the average value of multi-point measurement, for example, taking the average value of the thickness measurement values at at least three different positions, but not limited thereto. In some embodiments, the thickness measurement may be performed by a focused ion beam (FIB) and/or scanning electron microscope (SEM). For example, the electronic device 101 can be viewed in the first direction D1, and the electronic device 101 can have a display area and a peripheral area outside the display area. A cross-sectional structure diagram from the peripheral area to the display area may be taken using a focused ion beam (FIB) and/or scanning electron microscope (SEM), the cross-sectional structure diagram of the display area can be, for example, that shown in FIG. 1, and the thickness measurement may be a single-point measurement result or the average value of multi-point measurement in the cross-sectional structure diagram of FIG. 1, but the present disclosure is not limited to this. The above-mentioned display area is, for example, defined by the outer boundary formed by the connection lines between the display elements LE, that is, the display area includes all the display elements LE.

Figure 3:
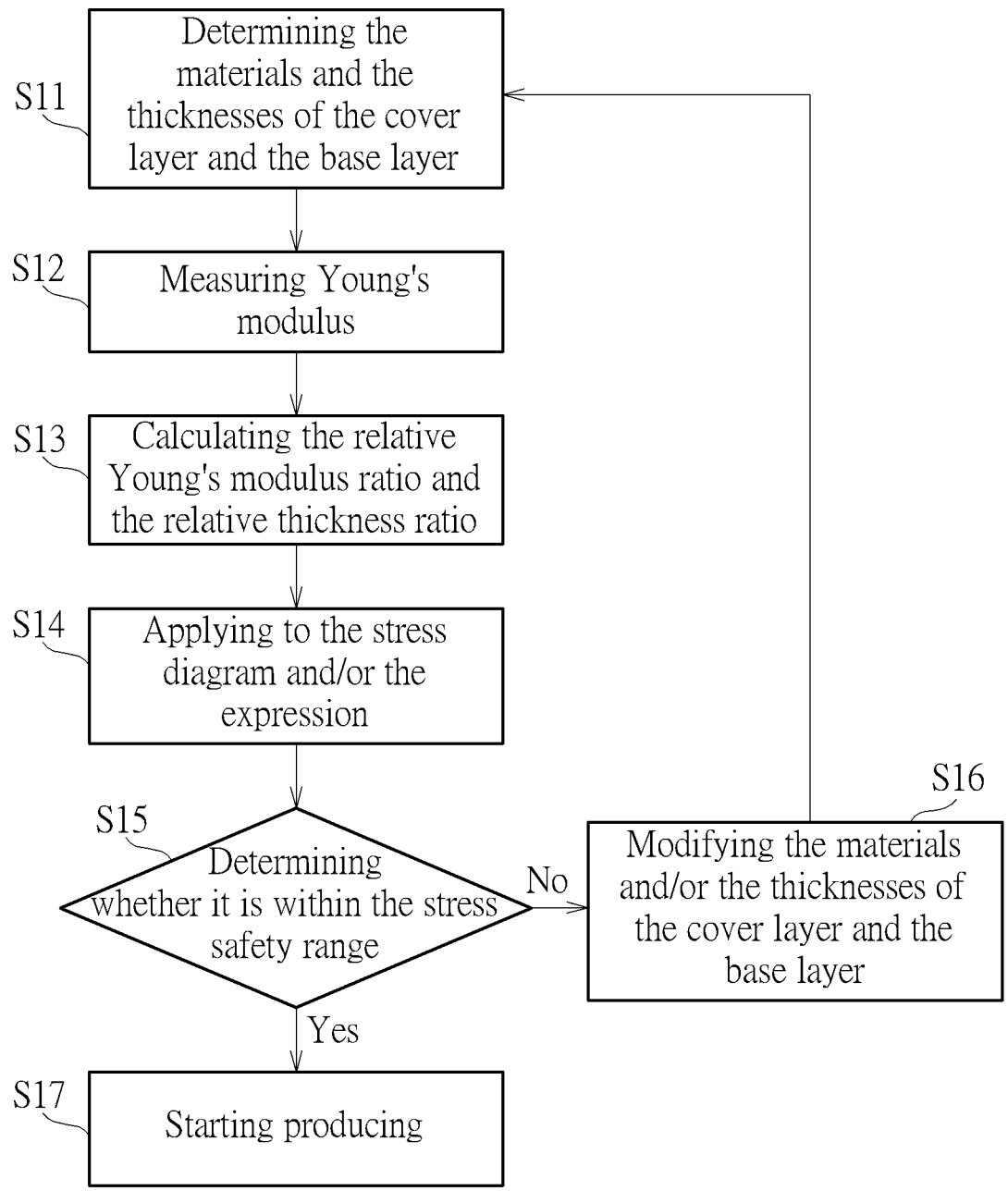
FIG. 3 is a flow chart of a method of evaluating a cover layer and a base layer in an electronic device according to an embodiment of the present disclosure.
Figure 4:
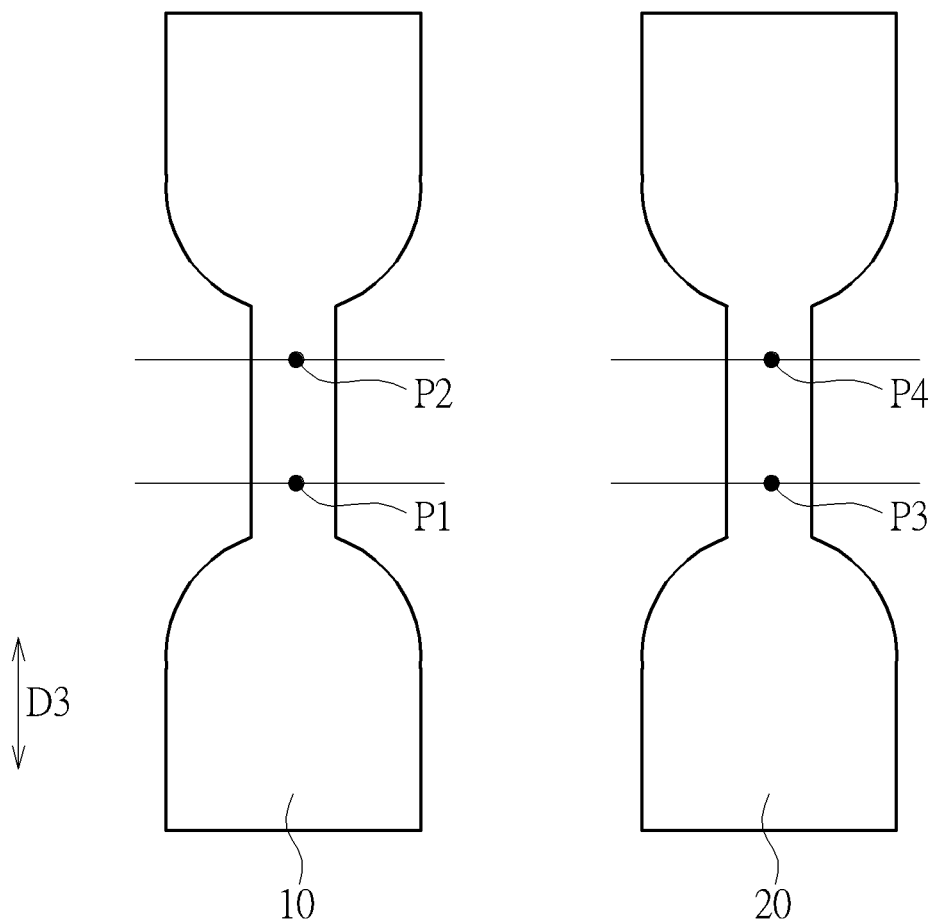
FIG. 4 is a schematic diagram illustrating a condition of measuring Young's modulus of a cover layer and a base layer in an electronic device according to an embodiment of the present disclosure.
Figure 5:
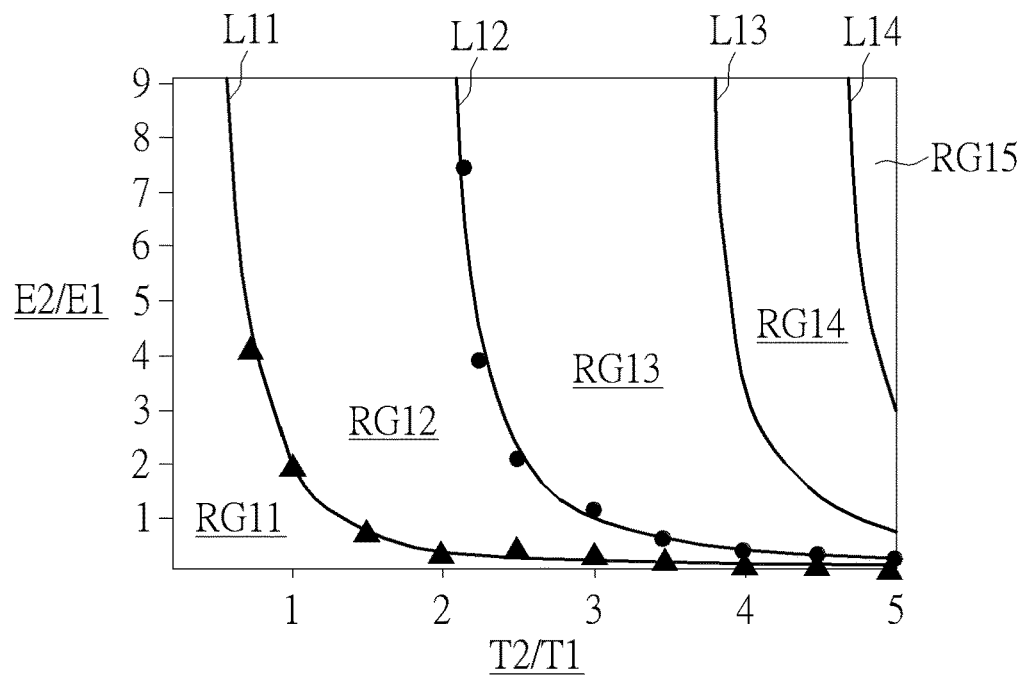
FIG. 5 is a schematic diagram of the relation between Young's modulus ratio and thickness ratio of a cover layer and a base layer in an electronic device according to an embodiment of the present disclosure.
Figure 6:
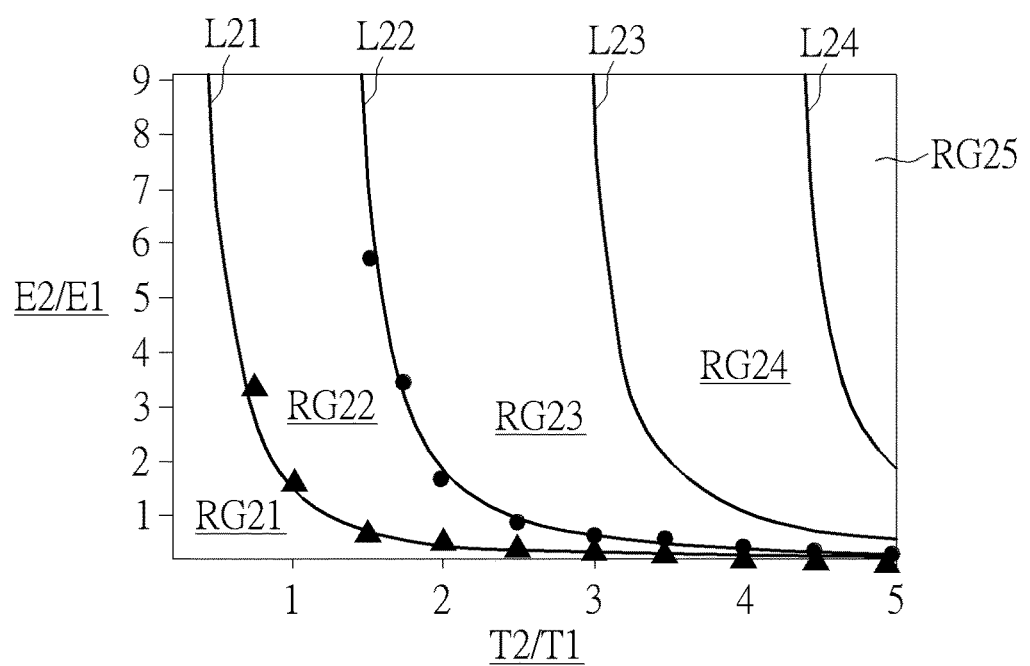
FIG. 6 is a schematic diagram of the relation between Young's modulus ratio and thickness ratio of a cover layer and a base layer in an electronic device according to another embodiment of the present disclosure.

Please refer to FIG. 1 and FIGS. 3-6. FIG. 3 is a flow chart of a method of evaluating a cover layer and a base layer in an electronic device according to an embodiment of the present disclosure, FIG. 4 is a schematic diagram illustrating a condition of measuring Young's modulus of a cover layer and a base layer in an electronic device according to an embodiment of the present disclosure, FIG. 5 is a schematic diagram of the relation between Young's modulus ratio and thickness ratio of a cover layer and a base layer in an electronic device according to an embodiment of the present disclosure, and FIG. 6 is a schematic diagram of the relation between Young's modulus ratio and thickness ratio of a cover layer and a base layer in an electronic device according to another embodiment of the present disclosure. As shown in FIG. 1 and FIG. 3, in some embodiments, the method of evaluating the cover layer 20 and the base layer 10 in the electronic device may include but is not limited to the following step. Firstly, in the step S11, the materials and the thicknesses of the cover layer 20 and the base layer 10 may be determined according to the requirements for protection, scratch resistance, support, and/or other functions. Subsequently, in the step S12, the Young's modulus of the cover layer 20 and the Young's modulus of the base layer 10 may be measured. In the step S13, the relative Young's modulus ratio between the cover layer 20 and the base layer 10 (such as a ratio of the Young's modulus of the cover layer 20 to the Young's modulus of the base layer 10, E2/E1) and the relative thickness ratio between the cover layer 20 and the base layer 10 (such as a ratio of the thickness of the cover layer 20 to the thickness of the base layer 10, T2/T1) may then be calculated. In the step S14, the relative Young's modulus ratio between the cover layer 20 and the base layer 10 and the relative thickness ratio between the cover layer 20 and the base layer 10 are applied in a stress diagram (such as FIG. 5 and/or FIG. 6) and/or an expression (such as the expression (I) described above and/or other expressions that will be explained later) for determining whether the material and thickness combination of the cover layer 20 and the base layer 10 is within the stress safety range in the step S15. Therefore, the step S16 will be carried out when the judgment result in the step S15 is not within the stress safety range for further modifying the materials and/or the thicknesses of the cover layer 20 and the base layer 10, and the steps S11-S15 may then be carried out again. Comparatively, the step S17 will be carried out when the judgment result in the step S15 is within the stress safety range for starting producing the electronic device with the determined material and thickness design of the cover layer 20 and the base layer 10.

Specifically, in some embodiments, the Young's modulus of the cover layer 20 to the Young's modulus of the base layer 10 may be measured and obtained by using the tensile testing machine, the universal testing machine, the push-pull machine (machine manufacturer: INSTRON CORPORATION, machine model: 5565), or other suitable machines capable of measuring the Young's modulus. In addition, the test method for the Young's modulus of the cover layer 20 and the base layer 10 can be based on the ASTM D882 (standard test method for tensile properties of plastic sheets) established by ASTM (American Society for Testing and Materials) or other suitable test benchmarks. For example, as shown in FIG. 1 and FIG. 4, the cover layer 20 and the base layer 10 may be cut into the test pieces with the shapes shown in FIG. 4, and specific points (such as a point P1, a point P2, a point P3, and a point P4 shown in FIG. 4) may be marked on the samples. Subsequently, two opposite sides of the test piece in a third direction D3 may be clamped by the fixture of the testing machine for stretching the test piece. During the test, image recognition may be used to measure the variation of the distance between the point P1 and the point P2 and the variation of the distance between the point P3 and the point P4, and the stain may be calculated by the test result to obtain the corresponding Young's modulus. In some embodiments, the test pieces used in the above measurement may be obtained by disassembling the electronic device 101. Therefore, a part of the electronic unit 30 may be attached to the test pieces of the cover layer 20 and the base layer 10, and the influence of the attached electronic unit 30 on the measurement results of the Young's modulus E2 of the cover layer 20 and the Young's modulus E1 of the base layer 10 may be negligible because the proportion of the thickness of the attached electronic unit 30 to the total thickness is relatively small. It is worth noting that, the comprehensive Young's modulus of the covering layer 20 composed of multiple layers of materials and the comprehensive Young's modulus of the base layer 10 composed of multiple layers of materials may be obtained by the above measurement method, that is, the Young's modulus E1 of the base layer 10 and the Young's modulus E2 of the covering layer 20 are not entirely dependent on the Young's modulus of the specific material in the base layer 10 and the cover layer 20, but may be affected by the proportional of the material layers in the base layer 10 and the cover layer 20, the bonding condition between the material layers, and/or other factors (such as the process conditions for manufacturing the base layer 10 and the cover layer 20). In other words, the Young's modulus of a single material layer in the base layer 10 cannot represent the Young's modulus E1 of the base layer 10, and the Young's modulus of a single material layer in the cover layer 20 cannot represent the Young's modulus E2 of the cover layer 20. In some embodiments, the thickness measurement described in the present disclosure may include measuring the area outside the test piece described above, but the present disclosure is not limited to this.

As shown in FIG. 1, FIG. 3, FIG. 5, and FIG. 6, the stress diagram used in the method of evaluating the cover layer and the base layer may include, for example, the condition of FIG. 5 and/or the condition of FIG. 6. The relationship lines in FIG. 5 and FIG. 6 (e.g., a line L11, a line L12, a line L13, and a line L14 in FIG. 5 and a line L21, a line L22, a line L23, and a line L24 in FIG. 6) respectively represent different stress conditions generated to the metal layer in the electronic unit 30 when the electronic device is bent and/or folded (for example, but not limited to the bending situation shown in FIG. 2). For example, FIG. 5 corresponds to the simulated stress results obtained in the condition when the Young's modulus of the metal layer in the electronic unit 30 is 70,000 megapascals (MPa), and FIG. 6 corresponds to the simulated stress results obtained in the condition when the Young's modulus of the metal layer in the electronic unit 30 is 110,000 MPa. The method for simulating the stress may include but is not limited to computer-aided engineering (CAE), such as ANSYS Mechanical, ABAQUS, Altair Optistruct, MSC.MARC, COMSO, and so forth. In some embodiments, the stress results may be simulated by theoretical calculations also. In one embodiment, the procedure of CAE may include but is not limited to the following steps. Firstly, a discrete network model may be established according to the external dimensions of the multilayer structure (such as the cover layer 20, the base layer 10, and the electronic unit 30). Subsequently, the corresponding material mechanical property parameters (such as but not limited to strength, hardness, ductility, and so forth) may be entered according to the material characteristics of the multilayer structure. Then, the corresponding boundary conditions may be set according to the stress condition of the multilayer structure (for example, the force applied for bending or rolling the multilayer structure) and the fixed position when the force is applied. Subsequently, the stress results may be obtained by numerical calculations with the computer.

Then, different design parameters (such as Young's modulus E1/Young's modulus E2, thickness T1/thickness T2) may be changed according to the aforementioned simulation method to obtain the corresponding stress value, and the relationship diagram (such as FIG. 5 and FIG. 6) can be drawn with the application software according to the obtained stress value, and this application software may include Minitab, Excel, etc., but not limited thereto. The following is illustrated with the embodiments of FIG. 5 and FIG. 6. In FIG. 5, the line L11, the line L12, the line L13, and the line L14 respectively represent the condition where the stress generated to the metal layer in the electronic unit 30 when the electronic device is bent and/or folded is 33.3 MPa, 210 MPa, 400 MPa, and 500 MPa. Therefore, a region RG11 in FIG. 5 represents a region where the stress is less than 33.3 MPa, a region RG12 in FIG. 5 represents a region where the stress ranges from 33.3 MPa to 210 MPa, a region RG13 in FIG. 5 represents a region where the stress ranges from 210 MPa to 400 MPa, a region RG14 in FIG. 5 represents a region where the stress ranges from 400 MPa to 500 MPa, and a region RG15 in FIG. 5 represents a region where the stress is greater than 500 MPa. Plastic deformation will be caused to the metal layer when the stress value described above is greater than the yield strength of the metal layer, and the metal layer may be cracked when the stress value described above is greater than the tensile strength of the metal layer. Therefore, for the metal line made of a metal material with a yield strength substantially equal to 33.3 MPa and a tensile strength substantially equal to 210 MPa (such as copper), the ratio of the Young's modulus E2 of the cover layer 20 to the Young's modulus E1 of the base layer 10 (E2/E1) accompanied with the ratio of the thickness T2 of the cover layer 20 to the thickness T1 of the base layer 10 (T2/T1) corresponding to the region RG12 and the region RG11 may be regarded as being within the stress safety range, and the region RG11 is a relatively safer range. In addition, the relationship lines in FIG. 5 and the corresponding expressions may be generated by regression analysis of points corresponding to the same stress level. The regression analysis can be carried out by, for example, application software, which can include Minitab, Excel, and so forth, but not limited thereto. For example, the line L12 may be generated by performing regression analysis to the round points in FIG. 5, and the round points are respectively the conditions where the same stress (such as 210 MPa) generated to the metal layer in the electronic unit 30 is calculated by simulating with different ratios of the Young's modulus E2 to the Young's modulus E1 and different ratios of the thickness T2 to the thickness T1, and the regression equation corresponding to the line L12 may be:

$$E2/E1 \leq 156.21 \times (T2/T1)^{-4.28}.$$

Similarly, the line L11 may be generated by performing regression analysis to the triangle points in FIG. 5, and the triangle points are respectively the conditions where the same stress (such as 33.3 MPa) generated to the metal layer in the electronic unit 30 is calculated by simulating with different ratios of the Young's modulus E2 to the Young's modulus E1 and different ratios of the thickness T2 to the thickness T1, and the regression equation corresponding to the line L11 may be:

$$E2/E1 \leq 2.13 \times (T2/T1)^{-2.23}.$$

Therefore, for keeping the stress generated to the metal layer in the electronic unit 30 within the safety range when the electronic device is bent and/or folded, the combination of the thickness T1 and the Young's modulus E1 of the base layer 10 and the thickness T2 and the Young's modulus E2 of the cover layer 20 may be kept at the line L12 and within the region below the line L12 (such as the region RG12 and the region RG11) for complying with the following expression (I).

$$E2/E1 \leq 156.21 \times (T2/T1)^{-4.28} \qquad (I)$$

Comparatively, for further reducing the stress generated to the metal layer in the electronic unit 30 when the electronic device is bent and/or folded, the combination of the thickness T1 and the Young's modulus E1 of the base layer 10 and the thickness T2 and the Young's modulus E2 of the cover layer 20 may be kept at the line L11 and within the region below the line L11 (such as the region RG11) for complying with the following expression (II).

$$E2/E1 \leq 2.13 \times (T2/T1)^{-2.23} \qquad (II)$$

Additionally, in FIG. 6, the line L21, the line L22, the line L23, and the line L24 respectively represent the condition where the stress generated to the metal layer (in the condition that the Young's modulus of the metal layer is 110,000 MPa) in the electronic unit 30 when the electronic device is bent and/or folded is 11 MPa, 90 MPa, 200 MPa, and 300 MPa. Therefore, a region RG21 in FIG. 6 represents a region where the stress is less than 11 MPa, a region RG22 in FIG. 6 represents a region where the stress ranges from 11 MPa to 90 MPa, a region RG23 in FIG. 6 represents a region where the stress ranges from 90 MPa to 200 MPa, a region RG24 in FIG. 6 represents a region where the stress ranges from 200 MPa to 300 MPa, and a region RG25 in FIG. 6 represents a region where the stress is greater than 300 MPa. For the metal line made of a metal material with a yield strength substantially equal to 11 MPa and a tensile strength substantially equal to 90 MPa (such as aluminum), the ratio of the Young's modulus E2 of the cover layer 20 to the Young's modulus E1 of the base layer 10 (E2/E1) accompanied with the ratio of the thickness T2 of the cover layer 20 to the thickness T1 of the base layer 10 (T2/T1) corresponding to the region RG22 and the region RG21 may be regarded as being within the stress safety range, and the region RG21 is a relatively safer range. In addition, the relationship lines in FIG. 6 and the corresponding expressions may be generated by regression analysis of points corresponding to the same stress level. For example, the line L22 may be generated by performing regression analysis to the round points in FIG. 6, and the round points are respectively the conditions where the same stress (such as 90 MPa) generated to the metal layer in the electronic unit 30 is calculated by simulating with different ratios of the Young's modulus E2 to the Young's modulus E1 and different ratios of the thickness T2 to the thickness T1, and the regression equation corresponding to the line L22 may be:

$$E2/E1 \leq 18.33 \times (T2/T1)^{-3.15}.$$

Similarly, the line L21 may be generated by performing regression analysis to the triangle points in FIG. 6, and the triangle points are respectively the conditions where the same stress (such as 11 MPa) generated to the metal layer in the electronic unit 30 is calculated by simulating with different ratios of the Young's modulus E2 to the Young's modulus E1 and different ratios of the thickness T2 to the thickness T1, and the regression equation corresponding to the line L21 may be:

$$E2/E1 \leq 1.43 \times (T2/T1)^{-2.1}.$$

Therefore, for keeping the stress generated to the metal layer in the electronic unit 30 within the safety range when the electronic device is bent and/or folded, the combination of the thickness T1 and the Young's modulus E1 of the base layer 10 and the thickness T2 and the Young's modulus E2 of the cover layer 20 may be kept at the line L22 and within the region below the line L22 (such as the region RG22 and the region RG21) for complying with the following expression (III).

$$E2/E1 \leq 18.33 \times (T2/T1)^{-3.15} \qquad (III)$$

Comparatively, for further reducing the stress generated to the metal layer in the electronic unit 30 when the electronic device is bent and/or folded, the combination of the thickness T1 and the Young's modulus E1 of the base layer 10 and the thickness T2 and the Young's modulus E2 of the cover layer 20 may be kept at the line L21 and within the region below the line L21 (such as the region RG21) for complying with the following expression (IV).

$$E2/E1 \leq 1.43 \times (T2/T1)^{-2.1} \qquad (IV)$$

Therefore, when the cover layer 20 and the base layer 10 are evaluated (such as the procedures shown in FIG. 3), the expression (I), the expression (II), the expression (III), the expression (IV), FIG. 5, and/or FIG. 6 described above may be used to determine whether the design combination is within the stress safety range, and the materials and/or the thicknesses of the cover layer 20 and the base layer 10 may be modified by using FIG. 5 and/or FIG. 6 when the design combination is not within the stress safety range. For example, when the Young's modulus of the metal layer in the electronic unit 30 is greater than 90,000 MPa (such as using the metal layer made of copper, titanium, molybdenum, steel, tungsten, or iron), FIG. 5, the expression (I), and/or the expression (II) described above may be used to determine whether the design combination of the cover layer 20 and the base layer 10 is within the stress safety range; and when the Young's modulus of the metal layer in the electronic unit 30 is less than 90,000 MPa (such as using the metal layer made of aluminum, magnesium, gold, silver, lead, or tin), FIG. 6, the expression (III), and/or the expression (IV) described above may be used to determine whether the design combination of the cover layer 20 and the base layer 10 is within the stress safety range, but not limited thereto. In some embodiments, the metal layer in the electronic unit 30 may be a multi-layer structure, and the Young's modulus of the middle layer or the thickest layer in the metal layer may be regarded as the Young's modulus of the metal layer when the metal layer is a multi-layer structure. For example, when the metal layer is a multi-layer structure composed of molybdenum (Mo)/aluminum (Al)/molybdenum (Mo), the Young's modulus of aluminum (the middle layer) may be regarded as the Young's modulus of the metal layer, and FIG. 6, the expression (III), and/or the expression (IV) may be used to determine whether the design combination of the cover layer 20 and the base layer 10 is within the stress safety range. In addition, according to the conditions shown in FIG. 5 and FIG. 6, the range of selectable materials will be very small when the ratio of the thickness T2 of the cover layer 20 to the thickness T1 of the base layer 10 is greater than 5, and the thickness T2 of the cover layer 20 and the thickness T1 of the base layer 10 should comply with following expression (V) accordingly, but not limited thereto.

$$T2/T1 \leq 5 \qquad (V)$$

The following description will detail the different embodiments of the present disclosure. To simplify the description, the following description will detail the dissimilarities among different embodiments and the identical features will not be redundantly described. In addition, identical components in each of the following embodiments are marked with identical symbols for making it easier to understand the differences between the embodiments. The features in each of the embodiments may be mixed or combined without departing from the spirit of the present disclosure or conflicting with each other.

Figure 7:
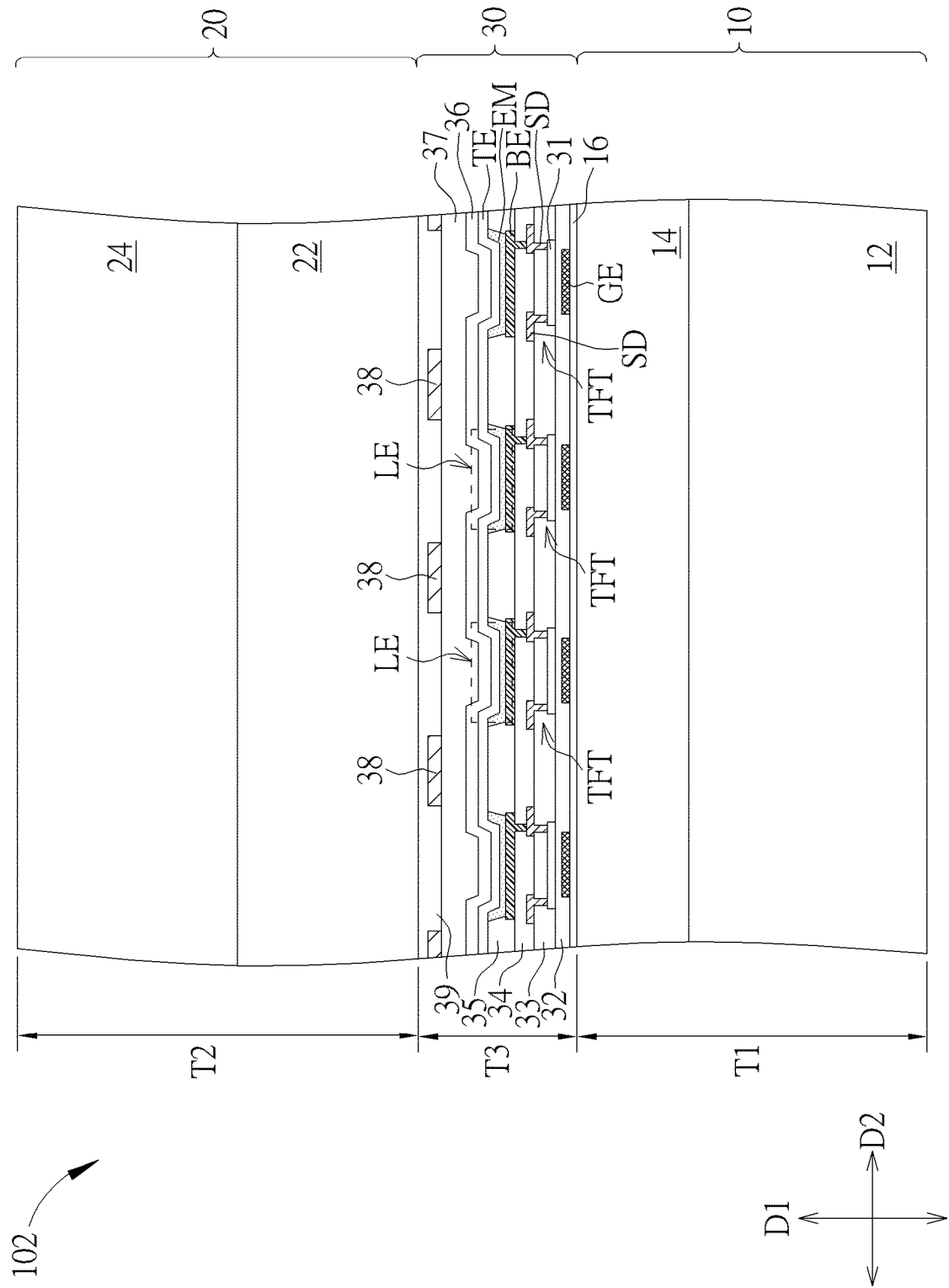
FIG. 7 is a schematic diagram illustrating a cross-sectional structure of an electronic device according to a second embodiment of the present disclosure.

Please refer to FIG. 7. FIG. 7 is a schematic diagram illustrating a cross-sectional structure of an electronic device 102 according to a second embodiment of the present disclosure. As shown in FIG. 7, in the electronic device 102, the gate electrode GE in each of the control elements TFT may be disposed between the dielectric layer 32 and the buffer layer 16, the semiconductor layer 31 may be disposed between the dielectric layer 33 and the dielectric layer 32, the source/drain electrode SD may be disposed above the semiconductor layer 31, and the control element TFT in the electronic device 102 may be regarded as a bottom gate transistor, but not limited thereto. It is worth noting that, in the present disclosure, the structure of the control element in the electronic unit 30 is not limited to the structure shown in FIG. 1 and FIG. 7 described above, and other suitable types of control elements may also be applied in the present disclosure according to some design requirements.

Figure 8:
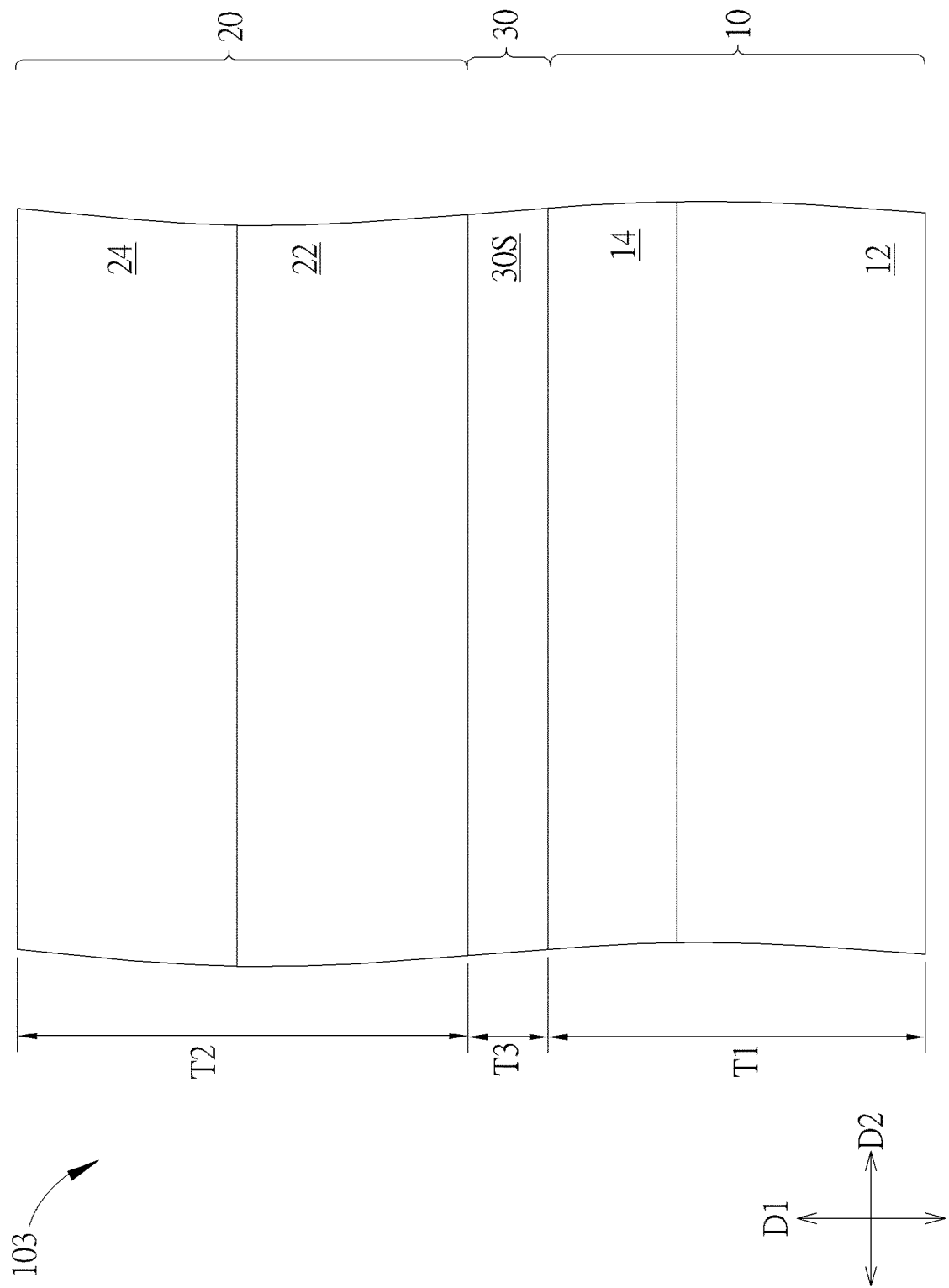
FIG. 8 is a schematic diagram illustrating a cross-sectional structure of an electronic device according to a third embodiment of the present disclosure.

Please refer to FIG. 8. FIG. 8 is a schematic diagram illustrating a cross-sectional structure of an electronic device 103 according to a third embodiment of the present disclosure. As shown in FIG. 8, in the electronic device 103, the electronic unit 30 may include a sensor 30S. The sensor 30S may be, for example, a sensor film. The sensor 30S may include an optical sensor, a radiation sensor, or other suitable types of sensors, and the electronic device may be regarded as a sensor plate, but not limited thereto.

To summarize the above descriptions, in the electronic device of the present disclosure, the thickness ration and the Young's modulus ratio between the base layer and the cover layer may be controlled for complying with the specific expression, and the stress generated to the metal layer in the electronic unit when the electronic device is bent and/or folded may be controlled accordingly. Therefore, the crack issue of the circuits in the electronic unit when the electronic device is bent and/or folded may be improved, and the reliability and/or the service life of the electronic device may be improved accordingly.

Although the embodiments and advantages thereof in the present disclosure have been disclosed as above, it should be understood that anyone with ordinary knowledge in the related technical field can make changes, substitutions, and decorations without departing from the spirit and the scope of this disclosure. Additionally, the scope of the protected range of this disclosure is not limited to the processes, machines, manufacturing, material compositions, devices, methods, and steps in the specific embodiments described in the description. Any person with ordinary knowledge in the related technical field may understand the current or future development of processes, machines, manufacturing, material composition, devices, methods and steps from the disclosed contents in this disclosure, as long as the substantially same functions carried out in the described embodiments or the substantially same results obtained in the described embodiments may be used in accordance with the present disclosure. Therefore, the protection scope of the present disclosure includes the above-mentioned processes, machines, manufacturing, material composition, devices, methods and steps. Additionally, each claim constitutes a separate embodiment, and the protection scope of the present disclosure also includes a combination of the claims and the embodiments. The protection scope of the present disclosure shall be determined by the scope of the claims listed below.

The above description is only related to the embodiments of the present invention, but not used for limiting the present invention. Those skilled in the art will readily observe that the present invention may have numerous modifications and alterations. Any modifications, equivalents replacements, improvements, etc. made in the spirits and principles of the present invention should be construed as the appended claims of the present invention.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A flexible electronic device, comprising:
a base layer having a thickness T1 and a Young's modulus E1;
an electronic unit disposed on the base layer; and
a cover layer disposed on the electronic unit, the cover layer having a thickness T2 and a Young's modulus E2, wherein the electronic unit comprises a metal layer, when a Young's modulus of the metal layer is greater than 90,000 MPa, the thickness T1, the thickness T2, the Young's modulus E1, and the Young's modulus E2 comply with following expression:

$$E2/E1 \leq 156.21 \times (T2/T1)^{-4.28}$$

and when the Young's modulus of the metal layer is less than 90,000 MPa, the thickness T1, the thickness T2, the Young's modulus E1, and the Young's modulus E2 comply with following expression:

$$E2/E1 \leq 18.33 \times (T2/T1)^{-3.15}.$$

2. The flexible electronic device according to claim 1, wherein the metal layer includes copper.

3. The flexible electronic device according to claim 1, wherein when the Young's modulus of the metal layer is greater than 90,000 MPa,
the thickness T1, the thickness T2, the Young's modulus E1, and the Young's modulus E2 further comply with following expression:

$$E2/E1 \leq 2.13 \times (T2/T1)^{-2.23}.$$

4. The flexible electronic device according to claim 3, wherein the metal layer includes copper.

5. The flexible electronic device according to claim 1, wherein the metal layer includes aluminum.

6. The flexible electronic device according to claim 1, wherein when the Young's modulus of the metal layer is less than 90,000 MPa, the thickness T1, the thickness T2, the Young's modulus E1, and the Young's modulus E2 further comply with following expression:

$$E2/E1 \leq 1.43 \times (T2/T1)^{-2.1}.$$

7. The flexible electronic device according to claim 6, wherein the metal layer includes aluminum.

8. The flexible electronic device according to claim 1, wherein the thickness T1 and the thickness T2 comply with following expression:

$$T2/T1 \leq 5.$$

9. The flexible electronic device according to claim 1, wherein the electronic unit is a display unit.

10. The flexible electronic device according to claim 1, wherein the electronic unit comprises:
a control element; and
a display element disposed above the control element.

11. The flexible electronic device according to claim 10, wherein the control element comprises a transistor.

12. The flexible electronic device according to claim 10, wherein the display element comprises
a first electrode;
a second electrode; and
a light emitting layer sandwiched between the first electrode and the second electrode.

13. The flexible electronic device according to claim 10, wherein the electronic unit further comprises:
a sensing element disposed above the display element.

14. The flexible electronic device according to claim 13, wherein the sensing element comprises a touch sensing element, an antenna, an image sensor, a pressure sensor, a temperature sensor, and/or a gas sensor.

15. The flexible electronic device according to claim 1, wherein the electronic unit comprises a sensor, and the sensor comprises an optical sensor, or a radiation sensor.

16. The flexible electronic device according to claim 1, wherein the base layer comprises:
a support layer; and
a flexible substrate disposed on the support layer.

17. The flexible electronic device according to claim 16, wherein the support layer comprises polyimide (PI) or polyethylene terephthalate (PET), and the flexible substrate comprises polyimide or a flexible material containing silicon and oxygen.

18. The flexible electronic device according to claim 1, wherein the cover layer comprises:
a protection layer; and
a functional layer disposed on the protection layer.

19. The flexible electronic device according to claim 18, wherein the functional layer comprises a polarizing layer or a retardation layer.

* * * * *